United States Patent [19]
Roggwiller

[11] Patent Number: 4,910,573
[45] Date of Patent: Mar. 20, 1990

[54] GATE TURN-OFF THYRISTOR AND METHOD OF PRODUCING SAME

[75] Inventor: Peter Roggwiller, Riedt-Neerach, Switzerland

[73] Assignee: BBC Brown Boveri AG, Baden, Switzerland

[21] Appl. No.: 177,489

[22] Filed: Apr. 4, 1988

[30] Foreign Application Priority Data

Apr. 7, 1987 [CH] Switzerland .......................... 1327/87

[51] Int. Cl.[4] ............................................. H01L 29/74
[52] U.S. Cl. ........................................ 357/38; 357/56; 357/86; 357/89; 357/90
[58] Field of Search ....................... 357/38, 56, 86, 89, 357/90

[56] References Cited

U.S. PATENT DOCUMENTS 4,742,382  5/1988  Jaecklin .................................. 357/38
4,757,025  7/1988  Bender .................................. 357/38

FOREIGN PATENT DOCUMENTS 64614    11/1982  European Pat. Off. .
2941021   4/1981  Fed. Rep. of Germany .
61-15366  1/1986  Japan .

OTHER PUBLICATIONS

M. Azuma et al., "An Ode Current Limiting Effect of High Power GTOs," IEEE Elec. Dev. Lett., vol. ED-L-1, #10, Oct., 1980, pp. 203-205.

Primary Examiner—Joseph E. Clawson, Jr.
Attorney, Agent, or Firm—Oblon, Spivak, McClelland, Maier & Neustadt

[57] ABSTRACT

A gate turn-off thyristor (GTO) having a semi-conductor substrate (1) with at least one p-conducting anode layer (4), one n-type base layer (6), one p-type base layer (7) which is in electrical contact with a gate; and one n-conducting cathode layer (8) has a cathode layer (8) with a highly doped zone (10) acting as n+ emitter and a lightly doped zone (9). The highly doped zone (10) adjoins the surface of the semi-conductor substrate (1) and has a doping density which is at least an order of magnitude higher than that of the p-type base layer (7). The lightly doped zone (9) is situated between a pn junction $J_1$, produced by the p-type base layer (7) and the cathode layer (8), and the highly doped zone (10) of the cathode layer (8). In a preferred embodiment of the invention, the highly doped zone (10) is so structured that the lightly doped zone (9) extends, in a GTO with mesa structure, from the pn junction $J_1$ to the surface of the semi-conductor substrate (1) in a central strip (5) of the cathode fingers (2). A method for producing GTO's according to the invention is furthermore specified.

2 Claims, 3 Drawing Sheets

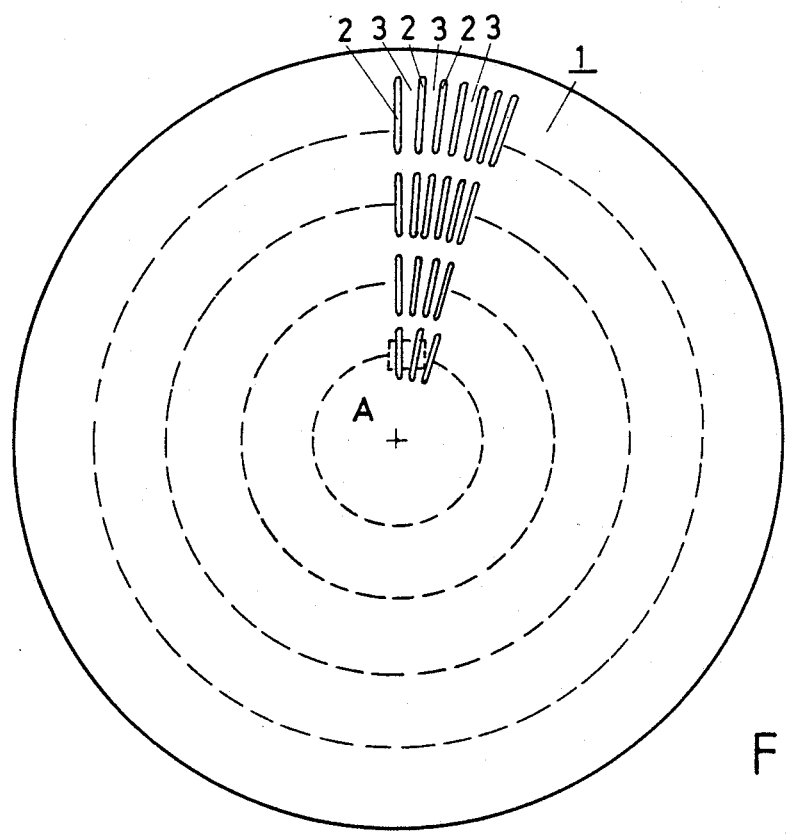
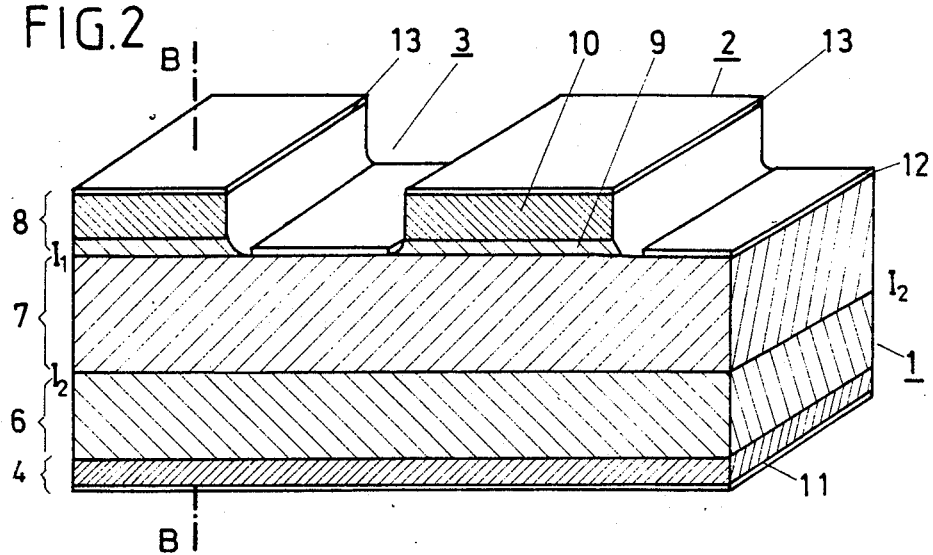

GATE TURN-OFF THYRISTOR AND METHOD OF PRODUCING SAME

Field of the Invention

The invention relates to a gate turn-off thyristor having a semi-conductor substrate and at least one p-doped anode layer, one n-type base layer, one p-type base layer which is in electrical contact with a gate, and one n-conducting cathode layer. It furthermore relates to a method of producing same.

DISCUSSION OF BACKGROUND

Thyristors which can be turned off via the gate, hereinafter termed GTO's for short, are at present able to block voltages of up to 4,500 V and turn off currents of up to 2,500 A. Such semi-conductor structures are in general composed of a large number of integrated individual thyristors with four-layer pnpn structures connected in parallel. The integrated individual thyristors have via common anode layers, a common n-type base layer, a common p-type base layer which is in contact with a gate, but via separate cathode layers. The cathode layers are highly doped and act as n+ emitters.

Such a GTO is described for example in EP-A2-0,066,850. The integrated individual thyristors are disposed on several concentric circles on a circular semiconductor substrate.

In order that high currents can be reliably switched, certain dimensioning criteria, principally in the region of the cathode and of the p-type base layer, have to be precisely adhered to. The switchable current depends, in particular, to a considerable extent on the transverse conductivity $\sigma_p$ of the p-type base layer.

In the case of a singly diffused p-type base layer, the conductivity can be improved only by increasing the number of mobile charge carriers. This can be achieved only by a greater layer thickness or by a higher doping density at the pn junction between cathode layer and p-type base layer. However, both these modifications have disadvantageous consequences. A greater thickness of the p-type base layer reduces the gain of the subsidiary npn transistor formed by n-type base layer, p-type base layer and cathode layer, as a result of which the GTO becomes less susceptible to triggering and slower to turn on, and a higher doping density in the region of the pn junction with the cathode layer lowers the breakdown voltage of said pn junction so that the risk of an avalanche breakdown on switching off the GTO becomes greater.

From the article entitled "Gate Turn-off Thyristors", Semiconductor Devices for Power Conditioning, Plenum Press, N.Y. 1982, by M. Kurata et al, it is known that the switchable anode current increases in proportion to the product of the breakdown voltage $V_{BJ1}$ of the pn junction $J_1$ between cathode layer and p-type base layer multiplied by the layer conductance $\sigma_p$ of the ptype base layer. Accordingly, a higher breakdown voltage $V_{BJ1}$ likewise results in higher switchable anode currents.

The breakdown voltage of a planar pn junction is known to depend substantially on the doping gradient at that point: the greater the doping gradient, the lower is the breakdown voltage. But in the case of a diffusion, however, maximum doping density, penetration depth and doping gradient are dependent on each other. It is therefore not possible to produce in this manner a cathode layer with high doping density, i.e. good emitter action, low penetration depth, which, because of the large part of the p-type base layer available, yields a good transverse conductivity $\sigma_p$, and with a low doping gradient at the pn junction, i.e. a high breakdown voltage.

SUMMARY OF THE INVENTION

Accordingly, one object of this invention is therefore to develop a gate turn-off thyristor (GTO) in in a manner such that the switchable anode current increases with the good switching parameters of the component being maintained. Furthermore, it is intended to provide a method for producing a GTO according to the invention.

These and other objects are achieved according to Applicant's invention by providing a new and improved gate turn-off thyristor (GTO) having a semiconductor substrate with at least one p-conducting anode layer, one n-type base layer, one p-type base layer which is in electrical contact with a gate, and one n-conducting cathode layer, wherein the cathode layer has a highly doped zone which acts as an n+ emitter and adjoins a surface of the semiconductor substrate and has a doping density at least an order of magnitude higher than the p-type base layer, and wherein the cathode layer has a lightly doped zone which adjoins the pn-junction formed by the cathode layer and the p-type base layer and has a doping density which is comparable to that of the p-type base layer at the pn-junction to the cathode layer. According to the invention, the diffusion of the highly doped zone of the cathode layer does not change the position and the properties of the pn-junctions previously produced in the semiconductor substrate.

The division according to the invention of the cathode layer into a highly doped zone which acts as n+ emitter and a lightly doped zone achieves a high breakdown voltage at the pn junction between cathode layer and ptype base layer despite the low penetration depth of the cathode layer.

In a preferred exemplary embodiment, the separate cathode layers of the integrated individual thyristors of the GTO are lightly doped, i.e. comparable with the p-type base layer, and have highly doped zones which act as n+ emitters only in the peripheral regions.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 shows a plan view of a GTO according to the invention,

FIG. 2 shows a detail A of the GTO according to the invention in a perspective representation.

DESCRIPTION OF THE PREFERRED EMBODIMENTS

Figure 3:
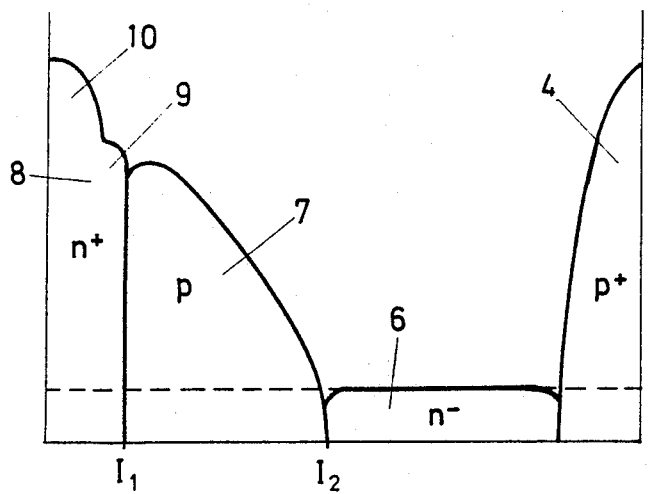
FIG. 3 shows a diagrammatic representation of the doping density of the GTO according to the invention along the line B—B shown in FIG. 2.

In a first exemplary embodiment, the structure and function of a GTO according to the invention with mesa structure is explained.

Referring now to the drawings, wherein like reference numerals designate identical or corresponding parts throughout the several views, in FIG. 1 such a component is shown. On a principal surface, a suitably doped semiconductor substrate 1 has a multiplicity of strip-like cathode fingers 2 which are arranged on concentric circles. The cathode fingers 2 are separated from each other by trenches 3.

FIG. 2 shows a detail from FIG. 1 in a perspective representation. The cathode fingers 2 are provided with cathode contacts 13. The trenches 3 are covered with a continuous metal layer which forms a gate contact 12. On a second principal surface of the semiconductor substrate, a metal layer is applied as anode contact 11.

The cathode fingers 2, which can be produced, for example, by etching the surface of the semi-conductor substrate 1, have a width of a few 100 $\mu$m and a length of a few mm. The trenches 3 have a depth of about 10-40 $\mu$m.

In its interior, the semi-conductor substrate 1 has a four-layer pnpn structure. An n-conducting cathode layer 8 is situated directly beneath the cathode contact 13. A p-type base layer 7 adjoins the cathode layer 8 and forms a first pn junction $J_1$ with it. The p-type base layer 7 emerges at the surface of the semi-conductor substrate 1 in the trenches 2 so that it can be triggered via the gate contact 12 already described. An n-type base layer 6 is situated beneath the p-type base layer 7. This produces a second pn junction $J_2$. Between the n-type base layer 6 and the anode contact 11 is situated a p-conducting anode layer 4.

In order to give the drawing a clearer form, layers of the same conduction type in FIG. 2 are hatched in the same direction. A dense hatching is intended to indicate a high doping density, a lighter hatching a lower-doping density.

According to the invention, the cathode layer 8 is divided up into a highly doped zone 10 and a zone 9 which is lightly doped relative to the latter. The highly doped zone 10 adjoins the cathode-side surface of the semi-conductor substrate 1 and extends up to a short distance in front of the pn junction $J_1$. The lightly doped zone 9 extends from the pn junction $J_1$ to the highly doped zone 10.

FIG. 3 shows a diagrammatic representation of the doping density along the line BB drawn in FIG. 2. In it, the cathode layer 8 with the lightly doped zone 9 and the highly doped zone 10, the p-type base layer 7, the n-type base layer 6 and the anode layer 4 can be recognised.

The doping density of the n-type base layer 6 corresponds to the basic doping of the semi-conductor substrate which is preferably between $10^{13}$ and $10^{14}$ cm$^{-3}$. The p-conducting anode layer 4 is highly doped and acts as p+ emitter. In order to obtain an optimum ohmic contact to the anode contact 11, the doping density of this layer is preferably between $10^{18}$ and $10^{20}$ cm$^{-3}$ at the surface of the semi-conductor substrate. If desired, the anode layer 4 may have n+ short circuits. The p-type base layer 7 at the pn junction $J_1$ preferably has a doping density of about $10^{18}$ cm$^{-3}$.

The cathode layer 8 is divided up, as already mentioned, into two zones. The highly doped zone 10 has the purpose of acting as n+ emitter. Its doping density should therefore be at least an order of magnitude higher than that of the p-type base layer 7. But in order to increase the breakdown voltage $V_{BJ1}$ of the pn junction $J_1$ according to the invention, the second lightly doped zone 9 is provided whose doping density should be comparable with that of the p-type base layer 7, for example about $10^{18}$ cm$^{-3}$. The purpose of said lightly doped zone 9 is to create a smaller doping gradient at the pn junction $J_1$ and to absorb the space charge zone which penetrates into the cathode layer 8. Since in a pn junction as has just been described, a voltage of approximately 20 V builds upper $\mu$m, the thickness of the lightly doped zone 9 is preferably 2-4 $\mu$m. If it is thinner, its effect is lost and if it is thicker, it has an adverse effect on the efficiency of the highly doped zone 10 which functions as n+ emitter.

The doping density of the highly doped zone 10 preferably exceeds $10^{19}$ cm$^{-3}$. In this manner, a good ohmic contact to the cathode contact 13 is ensured at the same time.

The highly doped zone 10 is so dimensioned in relation to thickness and doping density that it determines the layer properties, such as resistance and emitter efficiency, of the cathode layer 8. The lightly doped zone 9 forms an attribute of the cathode layer 8 which is intended to affect only the breakdown voltage of the pn junction $J_1$.

Such a GTO according to the invention yields the advantage of being able to switch fairly large anode currents while satisfactory switching parameters are otherwise maintained.

In a second exemplary embodiment, it is intended to describe a preferred refinement of the invention.

Again, the starting point is a GTO with mesa structure.

The second exemplary embodiment does not differ in external form from the first. Let the reference to FIG. 1 therefore replace a repetition of the description of the external elements.

Figure 5:
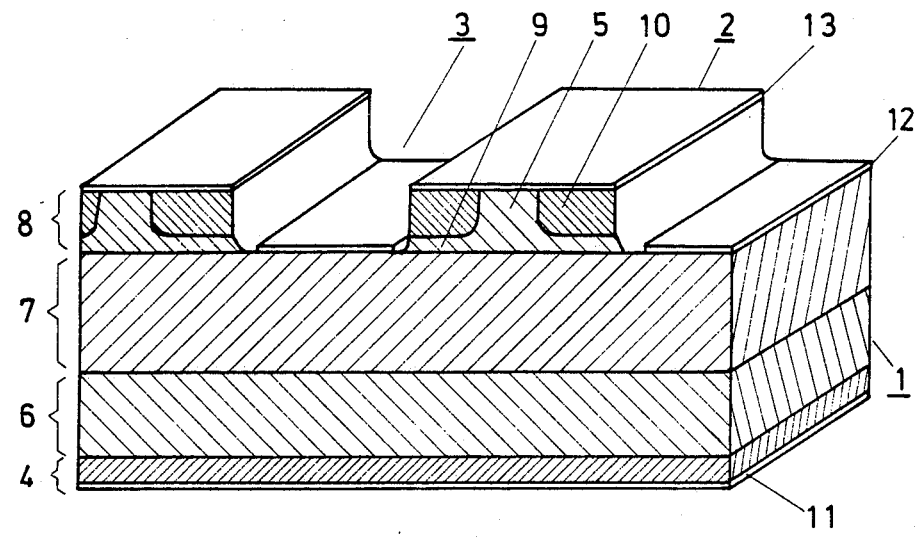
FIG. 5 shows a cross-section through a preferred embodiment of a GTO according to the invention.

FIG. 5 shows a detail from the second exemplary embodiment in a perspective representation. Anode layer 4, n-type base layer 6 and p-type base layer 7 have the same thicknesses and doping densities as in the example described previously.

A new feature is the configuration of the cathode layer 8. Here the lightly doped zone 9 does not have a constant thickness of a few pm but it extends in required regions, in particular in a central strip 5, up to the cathode contact 13. In this manner, the highly doped zone 10 which acts as n+ emitter is limited laterally.

Figure 6:
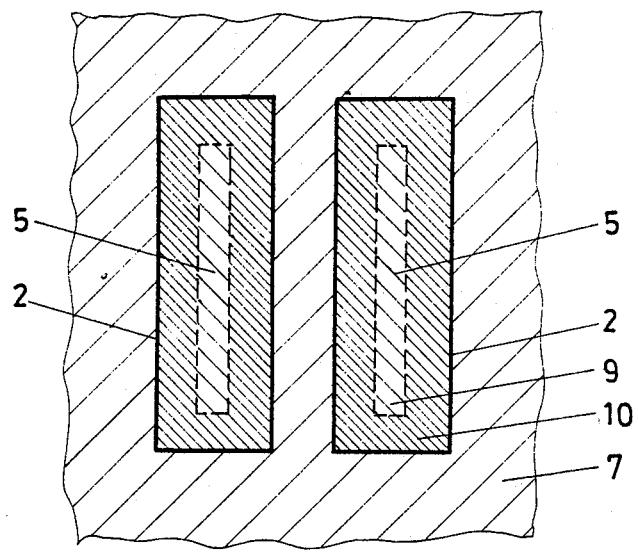
FIG. 6 shows a plan view of a preferred embodiment of a GTO according to the invention with mesa structure.

FIG. 6 shows two cathode fingers 2 in plan view. The hatching indicates the doping of the layer situated beneath the surface of the semi-conductor substrate, hatching in the same direction being used to indicate the same conduction type and the hatching density being used to indicate the doping density.

It can be seen that the cathode fingers 2 have a highly doped zone 10 which acts as emitter only at the edge. In the central strip 5, the lightly doped zone 9 extends from pn junction $J_1$ up to the surface.

This produces an advantageous action when the GTO is switched off.

If, after all, the highly doped zone 10 extends over the entire cathode finger 2, a focussing of the current in the central strip 5 of the cathode finger 2 is produced on switching off, which focussing is due to the constriction of the conducting part of the pn junction $J_1$. The high current densities which consequently occur can produce local thermal destruction of the component.

The GTO corresponding to a preferred embodiment of the invention neutralises said current focussing since the main part of the anode current flows in the peripheral regions of the cathode finger 2 and consequently, in the final stage of switching off, therefore shortly before pinching off, it is no longer necessary to suppress any substantial currents at all.

The invention also includes a method for producing a component according to the invention.

This method is distinguished by the fact tat the cathode layer 8 is produced by two diffusion steps. In this manner, an additional degree of freedom is obtained in producing the doping profile of the cathode layer 8, so that it becomes possible to choose not only the doping density at the surface of the semi-conductor substrate and the penetration depth of the layer, but also the doping gradient at the pn junction $J_1$ independently of each other.

The starting point is a semi-conductor substrate with a required basic doping. A preliminary deposition of dopant for producing a p-type base layer is carried out on a principal surface of the semi-conductor substrate intended for the cathode contact. In a subsequent diffusion step, the p-doping is driven in, but as yet not to the final penetration depth of the p-type base layer.

To produce the n-conducting cathode layer, preliminary deposition and diffusion are both carried out twice.

For a lightly doped zone of a cathode layer 8, a preliminary deposition with a similar surface coverage as for the p-type base layer is chosen. In the subsequent diffusion step, the pn junction between the cathode layer 8 and the p-type base layer 7 is driven in to the intended depth. The highly doped zone 10 of the cathode layer 8 is diffused in a manner such that the pn junctions already produced undergo no further change. A high surface concentration is driven in at a lower temperature than those of the preceding diffusion steps for a relatively short time.

As an exemplary embodiment, it is intended to explain below the production according to the invention of a GTO with mesa structure.

The starting point of the exemplary embodiment is a semi-conductor substrate with a basic doping of about $8 \times 10^{13}$ cm$^{-3}$. A principal surface of the semi-conductor substrate intended for the cathode contact is provided with a boron coverage of $5.0 \times 10^{15}$ cm$^{31\ 2}$. Then the boron is driven in at 1250° C. for 42 hours, which produces a temporary p-type base layer. According to the invention the cathode layer is diffused in two steps. In a first step, a phosphorus coverage of about $5.0 \times 10^{15}$ cm$^{-2}$ is driven in at 1250° C. for 14 hours. During this diffusion, the temporary p-type base layer is also driven in at the same time to the desired final penetration depth. In a second step, a phosphorus coverage of about $4.0 \times 10^{16}$ cm$^{-2}$ is diffused in at 1200° C. for four hours. In this process, the first diffusion produces the lightly doped zone and the second diffusion produces the highly doped zone of the cathode layer. Owing to the lower temperature of the second diffusion, the p-type base layer undergoes no further change during this step.

Figure 4:
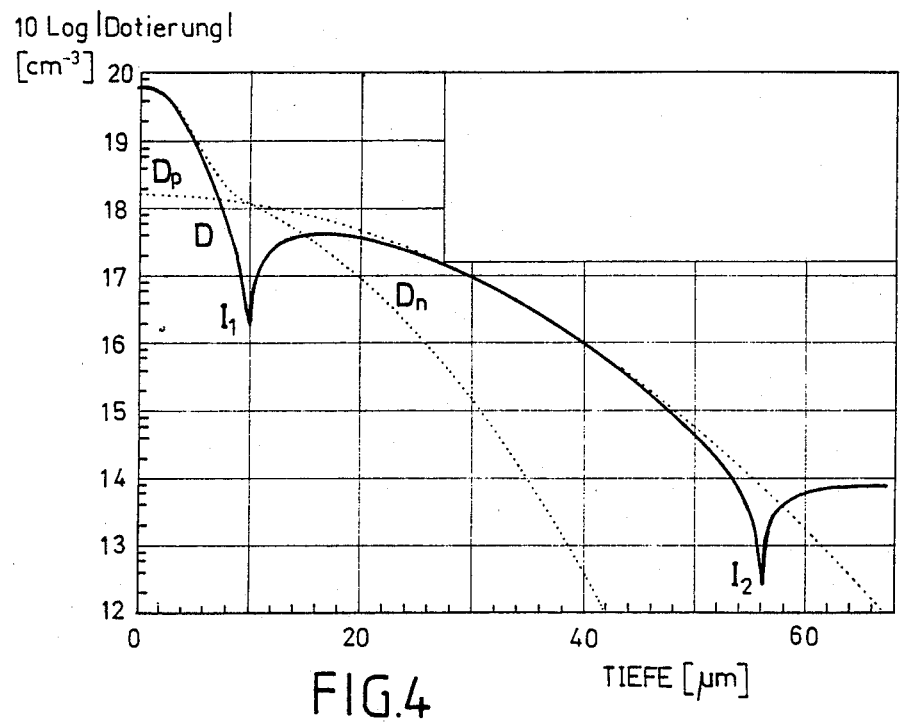
FIG. 4 shows a calculated doping density for a GTO produced according to the invention.

FIG. 4 shows the variation of a doping density calculated according to the method according to the invention. The continuous curve D corresponds to the final doping density, and the dotted lines $D_p$ and $D_n$ respectively represent the doping densities of the p-type and n-type impurities respectively.

The exemplary embodiment results in a component with a pn junction $J_1$ between cathode layer and p-type base layer at a depth of about 10 $\mu$m and a pn junction $J_2$ between p-type base layer and n-type base layer at a depth of about 56 $\mu$m. In FIG. 4, a levelling off according to the invention can be recognised in the case of the dotted curve $D_n$ about 2–3 $\mu$m in front of the pn junction $J_1$, and this has a favorable effect on the breakdown voltage $U_{BJ1}$ of the pn junction. The calculation yielded a breakdown voltage $V_{BJ1}$ of 31.38 V for a layer resistance of the ptype base layer of 59.58 ohm/sq. A comparable component calculated in accordance with the prior art has a breakdown voltage $V_{BJ1}$ which is only about half as high for about equally deep pn junctions, similar doping densities at the surface of the semi-conductor substrate and similar layer conductance of the p-type base.

The semi-conductor substrate which has been doped in the manner described above and into which an anode layer, not explained in more detail, has also been introduced in a known manner, is further processed to form a GTO with mesa structure using likewise known methods.

According to a preferred embodiment of the invention, the surface coverage which is used to produce the highly doped zone, which acts as emitter, of the cathode layer is structured in such a manner that, after the diffusion of said surface coverage, the lightly doped zone of the cathode layer extends in certain regions, in particular in a central strip of the cathode finger 2 of the GTO with mesa structure, from the pn junction $J_1$ up to the surface of the semi-conductor substrate.

Finally it may be stated that the invention provides a gate turn-off thyristor which switches fairly large anode currents with good properties otherwise being maintained and which can be produced in a simple manner.

Obviously, numerous modifications and variations of the present invention are possible in the light of the above teachings. It is therefore to be understood that within the scope of the appended claims, the invention may be practiced otherwise than as specifically described herein.

What is claimed as new and desired to be secured by Letters Patent of the U.S. is:

1. A gate turn-off thyristor with mesa structure, comprising:
- a semiconductor substrate with at least one p-conducting anode layer, one n-type base layer, one p-type base layer, which is in electrical contact with a gate, and one n-conducting cathode layer, wherein said cathode layer is divided up into plural individual cathode fingers by trenches;
- cathode contacts provided on the cathode fingers;
- a gate contact provided by a continuous metal layer covering the trenchers;
- a pn-junction formed between the p-type base layer and the n-conducting cathode layer;
- a diffused highly doped zone in the cathode layer, which acts as n$^+$ emitter and which adjoins a cathode-side surface of the semiconductor substrate and extends up to a short distance of about 2–4 $\mu$m in front of the pn-junction, said highly doped zone having a doping density at least an order of magnitude higher than the p-type base layer;

a diffused lightly doped zone in the cathode layer, which adjoins the pn-junction and extends to the highly doped zone, said lightly doped zone having a doping density which is comparable to that of the p-type base layer at the pn-junction; and a central strip of the cathode layer formed by said lightly doped zone extending from the pn-junction to the cathode contact of the cathode side surface of the semiconductor substrate, such that the highly doped zone is present only at the edge of the cathode fingers.

2. A gate turn-off thyristor with mesa structure, comprising:

a semiconductor substrate with at least one p-conducting anode layer, one n-type base layer, one p-type base layer, which is in electrical contact with a gate, and one n-conducting cathode layer, wherein said cathode layer is divided up into plural individual cathode fingers by trenches;

cathode contacts provided on the cathode fingers;

a gate contact provided by a continuous metal layer covering the trenches;

a pn-junction formed between the p-type base layer and the n-conducting cathode layer;

a diffused highly doped zone in the cathode layer, which acts as n+ emitter and which adjoins a cathode-side surface of the semiconductor substrate and extends up to a short distance of about 2–4 $\mu$m in front of the pn-junction, said highly doped zone having a doping density at least an order of magnitude higher than the p-type base layer;

a diffused lightly doped zone in the cathode layer, which adjoins the pn-junction and extends to the highly doped zone, said lightly doped zone having a doping density which is comparable to that of the p-type base layer at the pn-junction;

a central strip of the cathode layer formed by said lightly doped zone extending from the pn-junction to the cathode contact of the cathode side surface of the semiconductor substrate, such that the highly doped zone is present only at the edge of the cathode fingers;

wherein:

the p-type base layer has a thickness of about 45 $\mu$m and the cathode layer has a thickness of about 10 $\mu$m;

the maximum doping density of the highly doped zone exceeds $10^{19}$ cm$^{-3}$;

the doping density of the lightly doped zone is about $10^{18}$ cm$^+$;

the doping density of the p-type base layer at the pn-junction is about $10^{18}$ cm$^{-3}$;

the doping density of the n-type base layer is about $10^{13}$ cm$^{-3}$.

* * * * *